(12) United States Patent
Schulz et al.

(10) Patent No.: US 10,288,671 B2
(45) Date of Patent: May 14, 2019

(54) METHOD AND DEVICE FOR INSPECTING AN OPTOELECTRONIC COMPONENT ARRANGED ON A CONNECTION BOARD

(71) Applicant: OSRAM Opto Semiconductors GmbH, Regensburg (DE)

(72) Inventors: Robert Schulz, Schierling (DE); Anton Vogl, Sinzing (DE); Roland Zeisel, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/547,948

(22) PCT Filed: Jan. 14, 2016

(86) PCT No.: PCT/EP2016/050691
§ 371 (c)(1),
(2) Date: Aug. 1, 2017

(87) PCT Pub. No.: WO2016/124367
PCT Pub. Date: Aug. 11, 2016

(65) Prior Publication Data
US 2018/0024185 A1    Jan. 25, 2018

(30) Foreign Application Priority Data
Feb. 5, 2015   (DE) .................. 10 2015 101 671

(51) Int. Cl.
*G01R 31/26*    (2014.01)
*G01R 31/28*    (2006.01)

(52) U.S. Cl.
CPC ..... *G01R 31/2635* (2013.01); *G01R 31/2831* (2013.01)

(58) Field of Classification Search
CPC ... G11C 13/04; G11C 13/004; G11C 13/0014; G11C 2213/79; G01N 27/122;
(Continued)

(56) References Cited

U.S. PATENT DOCUMENTS

2002/0021226 A1*  2/2002  Clement ............... H01H 9/167
                                                              340/870.31
2002/0132383 A1   9/2002  Hiroki et al.
(Continued)

FOREIGN PATENT DOCUMENTS

CN     202471906 U     10/2012
DE  102013102322 A1     9/2014
(Continued)

OTHER PUBLICATIONS

Chen, Y.S. et al., "Study and Implementation of High Frequency Pulse LED Driver with Self-Oscillating Circuit," IEEE, 2011, 4 pages.
(Continued)

*Primary Examiner* — Vinh P Nguyen
(74) *Attorney, Agent, or Firm* — Slater Matsil, LLP

(57) ABSTRACT

A method and a device for inspecting an optoelectronic component are disclosed. In an embodiment, the method includes exciting at least one electromagnetic resonant circuit, formed by the at least one optoelectronic component and the connection board, such that the at least one optoelectronic component emits electromagnetic radiation, wherein exciting the electromagnetic resonant circuit comprises applying an electrical alternating voltage in the electromagnetic resonant circuit by generating a temporally variable electromagnetic alternating field by a first coil and a second coil, wherein the first coil and the second coil are movable with respect to the connection board.

19 Claims, 5 Drawing Sheets

(58) Field of Classification Search
CPC .......... G01N 27/4148; G01N 2201/067; G06F 3/0418; G01R 33/3692; G01R 33/34084; G01R 22/066; G01R 31/2635; G01R 33/3628; G01R 31/025; G01R 31/2831; G01R 33/287; G02F 1/0136; G02F 1/09; G02F 1/092; H04L 49/40

See application file for complete search history.

(56) References Cited

U.S. PATENT DOCUMENTS

2007/0236159 A1* 10/2007 Beland ............... H05B 33/0803
 315/312
2008/0103706 A1 5/2008 Wu et al.
2015/0230312 A1 8/2015 Akiya
2016/0003890 A1* 1/2016 Schulz ............... G01R 31/2635
 315/149

FOREIGN PATENT DOCUMENTS

| EP | 1777533 A1 | 4/2007 |
|---|---|---|
| JP | H11233745 A | 8/1999 |
| TW | 201429107 A | 7/2014 |
| WO | 2014135644 A1 | 9/2014 |

OTHER PUBLICATIONS

Choi, H.W. et al., "Fabrication of Matrix-Addressable Micro-LED Arrays Based on a Novel Etch Technique," Journal of Crystal Growth 268, 2004, 4 pages.

Li, P. et al., "Light Emitting Diode Fault Detection using p-n Junction Photovoltaic Effect," Review of Scientific Instruments 80, 055108, 2009, 7 pages.

* cited by examiner

METHOD AND DEVICE FOR INSPECTING AN OPTOELECTRONIC COMPONENT ARRANGED ON A CONNECTION BOARD

This patent application is a national phase filing under section 371 of PCT/EP2016/050691, filed Jan. 14, 2016, which claims the priority of German patent application 10 2015 101 671.0, filed Feb. 5, 2015, each of which is incorporated herein by reference in its entirety.

TECHNICAL FIELD

A method and a device for inspecting an optoelectronic component arranged on a connection board are provided.

BACKGROUND

The measurement of electro-optical properties of optoelectronic components generally takes place according to the prior art by applying a DC voltage to the optoelectronic component. Occasionally, optoelectronic components are at least temporarily present in a form in which their connections are short-circuited, that is to say in which there is a negligible ohmic resistance between their connections. This is the case particularly if optoelectronic components are arranged on a connection board, e.g., during the production of optoelectronic components. For example, optoelectronic components are mounted in a metallic lead frame composite, as a result of which the contacts of the optoelectronic components are short-circuited with respect to DC voltages. Consequently, these cannot be operated with DC current in order to determine their electro-optical properties for the purpose of process monitoring and/or process control.

While the optoelectronic components are singulated and provided with individually contactable connections at the end of the production process, it may be advantageous for the components not yet to be singulated and/or not yet to be made individually contactable at least during sub-steps of the production process. However, it is desirable to be able to measure electro-optical properties of the optoelectronic components even in such a state, for example, in order to pre-sort or to optimize the optoelectronic components and/or in order to adapt further production steps to the measured electro-optical properties. As a result, the rejects are reduced, thus affording a saving of time and costs.

In particular, the time required by lengthy production steps such as the curing of a conversion material, for example, can be better utilized. During the production of light emitting diodes, e.g., light emitting diodes which emit white light on the basis of volume conversion, the concentration and filling quantity of the conversion material are subject to fluctuations of varying magnitudes on account of current production methods. At present, in the manner of random sampling, an optoelectronic component is singulated and measured after the potting and baking of the material and can no longer be used for further production steps such as a plating step, for example.

DE 102013102322.3 discloses a method for measuring at least one optoelectronic component arranged on a connection board, which comprises exciting at least one electromagnetic resonant circuit, which is formed by the at least one optoelectronic component and the connection board, such that the at least one optoelectronic component is excited to emit electromagnetic radiation, and measuring at least one electro-optical property of the at least one optoelectronic component. The excitation of the electromagnetic resonant circuit can take place by inducing an electrical alternating voltage in the electromagnetic resonant circuit by generating a temporally variable electromagnetic alternating field. The inductive excitation has the advantage here that the excitation can take place in a contactless manner. The temporally variable electromagnetic alternating field can be generated, e.g., by an inductive element, in particular a coil with one or more turns.

By means of the method described in DE 102013102322.3, short-circuited optoelectronic components in a lead frame composite can be excited to emit light. However, if many optoelectronic components are connected in parallel, as is typical of many constructions, multiple optoelectronic components emit light simultaneously upon inductive excitation with a conventional coil design. A selective measurement, e.g., of the colour, of individual optoelectronic components is thus impossible.

In other constructions, the optoelectronic components to be measured are assigned to comparatively small regions in which an electromagnetic resonant circuit can be induced by the method described in DE 102013102322.3. In this case, comparatively high magnetic field densities are needed to excite the individual optoelectronic components to emit light. In many cases, it is very difficult to achieve the required field density using wire coils which have a conventional geometry in terms of their winding. Moreover, a coil design is desired in which the coils can be produced reproducibly and inexpensively even on a small scale

SUMMARY OF THE INVENTION

Embodiments of the invention provide a method and a device for inspecting an optoelectronic component arranged on a connection board, in which a selective excitation of optoelectronic components is improved by comparison with the prior art.

According to at least one embodiment of the first method for inspecting at least one optoelectronic component arranged on a connection board, the method comprises exciting at least one electromagnetic resonant circuit, which is formed by the at least one optoelectronic component and the connection board, such that the at least one optoelectronic component is excited to emit electromagnetic radiation. The excitation of the electromagnetic resonant circuit here comprises inducing an electrical alternating voltage in the electromagnetic resonant circuit by generating a temporally variable electromagnetic alternating field by means of a first coil and by means of a second coil.

Because a temporally variable electromagnetic alternating field is generated by means of a first coil and by means of a second coil, an improvement in the selective excitation of optoelectronic components in comparison with the use of a single wire coil, which has a conventional geometry in terms of its winding, is advantageously achieved. The distance between the connection board and the two coils can vary when the method is used, but is preferably kept constant. For example, the two coils can be passed over regions of various optoelectronic components at a constant distance from the connection board.

The invention is not limited to the excitation of a single electromagnetic resonant circuit with a single optoelectronic component. Rather, the excited electromagnetic resonant circuit can also comprise two or more optoelectronic components, the electro-optical property of which can be measured or observed. Moreover, multiple electromagnetic resonant circuits each with a single optoelectronic component or multiple electromagnetic resonant circuits each with multiple optoelectronic components can be excited. The electromagnetic resonant circuits can be independent of one another or they can be coupled to one another. Also, it is not necessary for the excitation of the electromagnetic resonant circuit or circuits to take place in the immediate local vicinity of the optoelectronic component or components. Rather, the regions of excitation and of the emission of electromagnetic radiation by the optoelectronic component(s) can also be at a distance from one another. An optoelectronic component here can in particular be an optoelectronic device or an element which, after further production steps have been performed, is present as an optoelectronic device. The optoelectronic component comprises at least one part that can be excited to emit electromagnetic radiation, in particular based on luminescence or phosphorescence. Preferably, the two coils travel in relation to the connection board, i.e., they are moved relative thereto, in order to excite selectively various optoelectronic components that are arranged on the connection board.

According to at least one embodiment of the method, the optoelectronic component is a light-emitting diode (LED), a laser diode, a semiconductor diode or a semiconductor chip, or it comprises a light-emitting diode (LED), a laser diode, a semiconductor diode or a semiconductor chip. A laser diode is a semiconductor diode which emits laser radiation. The emission of electromagnetic radiation in the optoelectronic component preferably takes place on the basis of luminescence or phosphorescence.

An electromagnetic resonant circuit is an electrical circuit that comprises inductive and/or capacitive elements. The total impedance of such an electrical circuit is generally complex-valued. In particular, an electromagnetic resonant circuit can comprise both inductive and capacitive elements. In this case, the absolute value of the total impedance attains a minimum upon excitation with a specific frequency. The electromagnetic resonant circuit can preferably be excited with this specific frequency.

According to at least one embodiment of the method, the optoelectronic component comprises a semiconductor layer sequence. The optoelectronic component preferably contains a III-V compound semiconductor material. III-V semiconductor materials are particularly suitable for generating radiation in the ultraviolet ($Al_xIn_yGa_{1-x-y}N$) through the visible ($Al_xIn_yG_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. In this context, $0≤x≤1$, $0≤y≤1$ and $x+y≤1$ in each case hold true, in particular where $x≠1$, $x≠1$, $x≠0$ and/or $y≠0$.

According to at least one embodiment of the method, the connection board is a lead frame composite, in particular a metal frame composite. A multiplicity of optoelectronic components can be arranged on the connection board. The connection board can comprise at least one connection conductor region, wherein a respective optoelectronic component can be arranged in each connection conductor region. A connection conductor region is a region in which connection conductors are formed. In particular, connection conductors which can serve as connections for the electrical interconnection of the optoelectronic component during a process for manufacturing the optoelectronic component and/or after the completion of the optoelectronic component can be formed in the connection conductor region.

According to at least one embodiment of the method, at least one electro-optical property of the at least one optoelectronic component is measured. For example, the electro-optical property of the optoelectronic component is the brightness, the color locus or the spectrum of the electromagnetic radiation emitted by the optoelectronic component. Further properties of the optoelectronic component can be determined on the basis of the measured electro-optical property. By way of example, it is possible to determine at least one lifetime of at least one type of charge carriers in the optoelectronic component or in at least one part of the optoelectronic component.

According to at least one embodiment of the method, it is provided that the first coil and the second coil are arranged at a distance from one another laterally. A lateral direction here is understood in particular to be a direction perpendicular to an axis of symmetry of the first and/or second coil and in particular to an axis of symmetry of a magnetic field generated by the first and/or second coil.

According to at least one embodiment of the method, it is provided that a distance between a central axis of the first coil and a central axis of the second coil is between 1 mm and 10 cm, preferably between 1 cm and 5 cm, in a lateral direction. Preferably, the two central axes each coincide with the axes of symmetry of the two coils.

According to at least one embodiment of the method, it is provided that a current flowing through the first coil is proportional to a current flowing through the second coil. Preferably, the first coil and the second coil are connected to one another in series, such that the current flowing through the first coil is the same as the current flowing through the second coil.

According to at least one embodiment of the method, it is provided that the current flowing through both the first coil and the second coil is an alternating current. For example, an alternating voltage is applied to each of the two coils. The alternating voltage is preferably a high-frequency voltage. The frequency of the high-frequency voltage is, e.g., 1 MHz to 10 GHz, preferably 10 MHz to 1 GHz and particularly preferably 25 MHz to 500 MHz.

According to at least one embodiment of the method, it is provided that a magnetic field inside the first coil is directed antiparallel to a magnetic field inside the second coil. This property can be restricted to specific limited time intervals. Preferably, the magnetic field inside the first coil is directed antiparallel to a magnetic field inside the second coil for more than 90% of a temporal period of the alternating current used in the two coils, particularly preferably for the entire period, i.e., at every point in time while the method is being carried out. This preferably results in the first coil generating a portion of the electromagnetic alternating field in the opposite phase to that of the second coil. As a result, two counter-directional currents, preferably two currents with opposite directions of rotation, are induced by the two coils on the connection board. An electromagnetic resonant circuit is or electromagnetic resonant circuits are excited only in a reduced area of the connection board in this case. The first and second coils preferably have the same number of windings in this embodiment.

As a result of the locally restricted excitation of the electromagnetic resonant circuit, an electro-optical property of an individual optoelectronic component can be measured or observed without adjacent optoelectronic components, which are arranged, e.g., on the same connection board, also being excited to emit electromagnetic radiation. Appropriate positioning of the two coils can in particular result in the voltages induced by the two coils adding up exactly such that precisely one optoelectronic component can be made to emit light.

According to at least one embodiment of the method, it is provided that a magnetic field inside the first coil is directed parallel to a magnetic field inside the second coil. This property can likewise be restricted to specific limited time intervals. Preferably, the magnetic field inside the first coil is directed parallel to a magnetic field inside the second coil for more than 90% of a temporal period of the alternating current used in the two coils, particularly preferably for the entire period, i.e., at every point in time while the method is being carried out. This preferably results in the first coil generating a portion of the electromagnetic alternating field in the same phase as that of the second coil. As a result, two synchronous currents, preferably two currents with the same direction of rotation, are induced by the two coils on the connection board. An electromagnetic resonant circuit is or electromagnetic resonant circuits are excited in an enlarged area of the connection board with the exception of a central region. In the central region, no electromagnetic resonant circuit is excited or only one having an insufficiently high current to excite an optoelectronic component arranged in the central region to emit electromagnetic radiation. In this embodiment, the first and second coils can differ in their number of windings.

As a result of the locally restricted excitation of the electromagnetic resonant circuit, an electro-optical property of multiple optoelectronic components, arranged, e.g., in a ring, can be measured or observed while at least one centrally arranged component remains deliberately inactive.

According to at least one embodiment of the method, it is provided that a first portion of the temporally variable electromagnetic alternating field, which is generated by the first coil, and a second portion of the temporally variable electromagnetic alternating field, which is generated by the second coil, are each incapable of exciting the optoelectronic component or one of the optoelectronic components to emit electromagnetic radiation. For example, the voltage induced by one of the two coils in each case can be lower than a forward voltage of the optoelectronic component.

According to at least one embodiment, the first coil and/or the second coil is/are in the form of a flat coil, e.g., a flat coil as described below, in each case.

According to at least one embodiment, the first and/or second coils have/has concentric windings. In other words, each winding of the respective coil in this case has the same mid-point or center of gravity within the limits of manufacturing tolerance. The windings of a coil, if it is a wire coil, for example, can all have the same circumference. Alternatively, the circumference of the windings can also vary, for example, it can decrease continuously between adjacent windings.

According to at least one embodiment, the first coil and/or the second coil have/has windings that are offset from one another. For example, within the limits of manufacturing tolerance the mid-points or centers of gravity of the respective windings are next to one another on a straight line running in lateral direction. For example, the respective coil has n windings, wherein n is an integer greater than one. E.g., the mid-point or center of gravity of each m-th winding, with $1<m<n$, is then offset by a distance $\Delta x$ in a lateral direction relative to the mid-point or center of gravity of the (m−1)-th winding. The mid-point or center of gravity of the (m+1)-th winding is preferably offset in the same lateral direction, particularly preferably by the same distance $\Delta x$, relative to the mid-point or center of gravity of the m-th winding. For example, $\Delta x$ is between 1 mm and 10 mm inclusive.

According to at least one embodiment, the circumference of each m-th winding is smaller than the circumference of each (m−1)-th winding. In other words, the circumference of the windings decreases continuously. For example, the circumference of each m-th winding is no more than 90% or no more than 70% or no more than 50% of the circumference of the (m−1)-th winding. For example, the circumference decreases by between 2 mm and 20 mm inclusive from one winding to the next winding.

According to at least one embodiment, the first and/or second coil have/has a region with a higher or maximum winding density and an opposite region in a lateral direction with a lower or minimum winding density. Preferably, the winding density in the one region is at least 3 times or at least 5 times or at least 10 times or at least 20 times as high as in the opposite region. This can be achieved, e.g., by the mid-points or centers of gravity of the windings being offset from one another and the circumference of the windings decreasing at the same time. In a lateral direction along the straight line along which the mid-points or centers of gravity are offset from one another, the winding density can then increase or decrease. The straight line intersects the region with higher winding density and the region with lower winding density, for example.

According to at least one embodiment, both the first coil and the second coil have windings that are offset from one another. Preferably, the mid-points or centers of gravity of the windings of both coils lie on a common straight line in a lateral direction. Preferably, both the first coil and the second coil each have a region with a higher and a region with a lower winding density. The regions of the first and second coil having a higher winding density preferably face towards one another; the regions with a lower winding density preferably face away from one another. In this way, a further reduction in the area on the connection board in which an electromagnetic resonant circuit is excited can be obtained.

For example, the mid-point or center of gravity of the winding with the smallest circumference of the first coil is at a distance of between 0.5 mm and 5 mm inclusive from the mid-point or center of gravity of the winding with the smallest circumference of the second coil.

According to at least one embodiment of the second method for inspecting at least one optoelectronic component arranged on a connection board, the method comprises exciting at least one electromagnetic resonant circuit, which is formed by the at least one optoelectronic component and the connection board, such that the at least one optoelectronic component is excited to emit electromagnetic radiation. The excitation of the electromagnetic resonant circuit here comprises inducing an electrical alternating voltage in the electromagnetic resonant circuit by generating a temporally variable electromagnetic alternating field by means of a flat coil.

The flat coil typically has the shape of an Archimedean spiral, at least in some regions. Preferably, the flat coil has at least two windings, particularly preferably at least five windings. The flat coil can have an area of, e.g., more than 1 cm2, preferably more than 10 cm2. The flat coil may optionally have a ferrite core.

By using a flat coil, higher field strengths and a better convergence of the temporally variable alternating electromagnetic field can be achieved. Thus, optoelectronic components can be inductively excited to emit light in cases where the field strengths and densities of coils with a conventional winding geometry are inadequate. Likewise, a reduction in the necessary excitation power—to about 10% in many cases—can be achieved as a result of the stronger field convergence.

The flat coil can be formed by a wound metal wire. Alternatively, it can be formed by a patterned circuit board. Flat coils based on circuit boards are simpler to produce, can be produced cheaply even on a relatively small scale and can be adapted more individually to the geometry of the connection board, in particular of the lead frame composite. Furthermore, the reproducibility is significantly higher than with hand-wound coils.

According to at least one embodiment of the method, at least one electro-optical property of the at least one optoelectronic component is measured. For example, the electro-optical property of the optoelectronic component is the brightness, the color locus or the spectrum of the electromagnetic radiation emitted by the optoelectronic component. Further properties of the optoelectronic component can be determined on the basis of the measured electro-optical property. By way of example, it is possible to determine at least one lifetime of at least one type of charge carriers in the optoelectronic component or in at least one part of the optoelectronic component.

The invention furthermore relates to a method for optimizing an optoelectronic component. According to at least one embodiment, the method comprises performing one of the two methods according to the invention for inspecting an optoelectronic component, comparing the at least one measured electro-optical property of the optoelectronic component with a desired value and modifying the optoelectronic component on the basis of the comparison. Modifying can comprise, in particular, adapting the electro-optical property to the desired value. Optionally or additionally, the method can comprise sorting optoelectronic devices on the basis of the measured electro-optical property.

Optionally or additionally, the method can furthermore comprise adapting a production step on the basis of the comparison of the measured electro-optical property with the desired value. The production step can be, in particular, applying a conversion material to an LED, in particular a white-light-generating LED. The LED can comprise, for example, a housing, a blue semiconductor chip, a conversion material and, if appropriate, further potting materials.

In this case, the electro-optical property of the optoelectronic component is preferably the color locus of the electromagnetic radiation emitted by the optoelectronic component. Preferably, when the conversion material is applied, the quantity of the conversion material and/or the concentration of a conversion substance contained therein are/is adapted depending on the measured color locus in order to achieve desired color properties of the finished LED and/or to obtain a narrower color distribution. Although the spectrum of the electromagnetic radiation emitted by an LED has a slight temperature dependence and the LED heats up on account of the excitation with a high-frequency voltage, the color locus can be determined sufficiently accurately by the method according to the invention. After the conversion material has been applied, the optoelectronic component can be provided with, for example, a housing or an optical element. If multiple optoelectronic components are arranged on the connection board, then the composite comprising connection board and optoelectronic components can subsequently be singulated. In this case, the common connection board is divided into multiple connection boards, such that the finished optoelectronic components each have a connection board.

The invention furthermore relates to a device for inspecting an optoelectronic component. According to at least one embodiment, the device comprises a connection board, on which at least one optoelectronic component is arranged, and means for exciting an electromagnetic resonant circuit comprising the connection board and the at least one optoelectronic component. The means here comprise a flat coil or a first coil and a second coil.

The device preferably also comprises a measuring device, which is designed to measure at least one electro-optical property of the optoelectronic component.

The described devices are particularly suitable for performing the methods described further above. Features explained in association with the method can therefore also be used for the devices, and vice versa

BRIEF DESCRIPTION OF THE DRAWINGS

Further advantages, advantageous embodiments and developments will become apparent from the exemplary embodiments described below in association with the figures.

In the figures.

Figure 1:
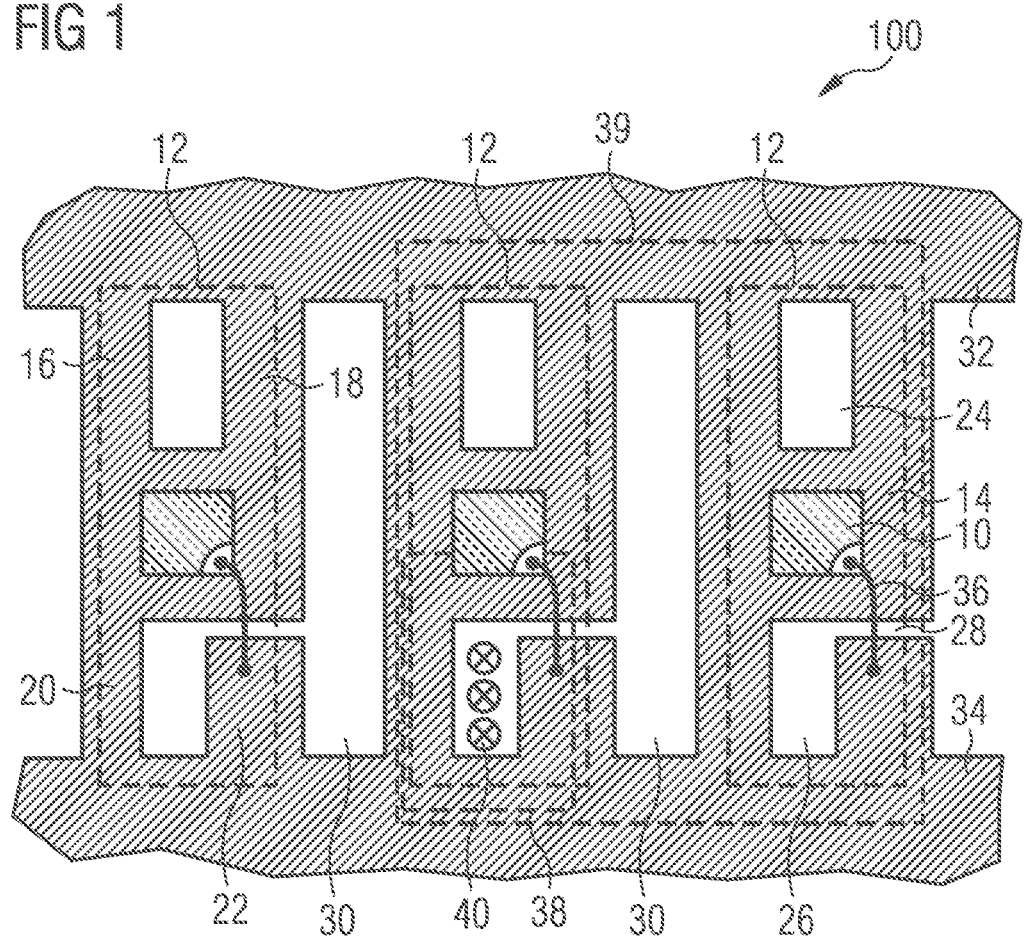
FIG. 1 shows a plan view of a first exemplary embodiment of a connection board, to which a method for inspecting an optoelectronic component is applicable.

Identical or similar elements or elements having the same effect are provided with the same reference numbers in the figures. The figures and the size ratios to one another of the elements illustrated in the figures should not be considered as being to scale. Rather, to illustrate them better and/or to make them easier to understand, the size of individual elements may be exaggerated.

DETAILED DESCRIPTION OF ILLUSTRATIVE EMBODIMENTS

A cross enclosed by a circle in a drawing indicates a magnetic field which is directed into the plane of the drawing at a specific point in time. However, the magnetic fields used in the present case are temporally variable, and a magnetic field directed into the plane of the drawing at one specific point in time can be directed out of the plane of the drawing at another point in time. Only the crucially involved magnetic field lines are illustrated.

FIG. 1 shows a plan view of a first exemplary embodiment, designated overall by 100, of a connection board to which a method for inspecting an optoelectronic component is applicable. Optoelectronic components 10 are arranged on the connection board 100, which is a lead frame composite made of metal, for example. The connection board 100 comprises three connection conductor regions 12, which are arranged at regular distances from one another and each have the same structure and alignment. Each of the connection conductor regions 12 comprises a central region 14 and first to fourth connection conductors 16, 18, 20, 22, each having the same width, wherein in each case the first connection conductor 16 and the second connection conductor 18 are arranged on a first side of the central region 14 and the third connection conductor 20 and the fourth connection conductor 22 are arranged on a second side of the central region 14, the second side being situated opposite the first side. There is in each case a first interspace 24 between the first and second connection conductors 16, 18 on the first side of the central region 14, and there is in each case a second interspace 26, having the same width as the first interspace 24, between the third and fourth connection conductors 20, 22 on the second side of the central region 14. Furthermore, in each connection conductor region 12, in each case the fourth connection conductor 22 on the second side of the central region 14 is separated from the central region 14 by a third interspace 28; the first to third connection conductors 16, 18, 20 in each case directly adjoin the central region 14.

The connection conductor regions 12 are separated from one another overall by fourth interspaces 30. The width of the third interspaces 28 is less than the width of the first and second interspaces 24, 26, and the width of the first and second interspaces 24, 26 is less than the width of the fourth interspaces 30. The connection board 100 furthermore comprises a first bridging region 32 and a second bridging region 34, which are arranged on opposite sides of the connection conductor regions 12. In each connection conductor region 12, in each case the first and second connection conductors 16, 18 on the first side of the central region 14 are connected to the first bridging region 32, and the third and fourth connection conductors 20, 22 on the second side of the central region 14 are connected to the second bridging region 34. The first and second bridging regions 32, 34 thus form a conductive connection between the connection conductor regions 12.

A respective optoelectronic component 10 is arranged on the central region 14 of each connection conductor region 12, one connection of the optoelectronic component being in direct electrical contact with the central region 14. The central region 14 thus acts as a first connection region for the connection of the optoelectronic component 10. A second connection of the optoelectronic component 10 is connected to the fourth connection conductor 22 in each case by a bonding wire 36 across the third interspace 28. The fourth connection conductor 22 thus acts as a second connection region for the connection of the optoelectronic component 10. Consequently, the optoelectronic component 10, the bonding wire 36, the fourth connection conductor 22, a part of the second bridging region 34, the third connection conductor 20 and a part of the central region 14 in each case form an electromagnetic resonant circuit 38. By virtue of the fact that the electromagnetic resonant circuit 38 is formed around the second interspace 26, the inductance and capacitance present in the surroundings of the second interspace 26 are utilized for the electromagnetic resonant circuit 38. An electrical alternating voltage can be induced in the electromagnetic resonant circuit 38 by means of a temporally variable magnetic field 40 present in the second interspace 26.

FIG. 1 additionally depicts purely by way of example a second electromagnetic resonant circuit 39, which is formed by a further region of the connection board 100 that includes two adjacent optoelectronic components 10. This is intended to make it clear that, depending on the geometry of the connection board 100 and the optoelectronic components 10 arranged thereon on the one hand and the spatial distribution of the magnetic field strength and also the frequency of the alternating field on the other hand, multiple optoelectronic components 10 can be excited to emit electromagnetic radiation. In this case, the intensity of the respectively emitted radiation can vary greatly between the optoelectronic components 10. For example, the electromagnetic resonant circuit 39 can be formed by multiple connection conductors and parts of the bridging regions. In a manner similar to that in the case of the electromagnetic resonant circuit 38, the inductance and capacitance present in the (further) surroundings of the second interspace 26 are utilized for the electromagnetic resonant circuit 39. An electrical alternating voltage can in turn be induced in the electromagnetic resonant circuit 39 by means of a temporally variable magnetic field 40 present in the second interspace 26. The two included adjacent optoelectronic components 10 can thereby be excited to emit electromagnetic radiation.

Figure 2:
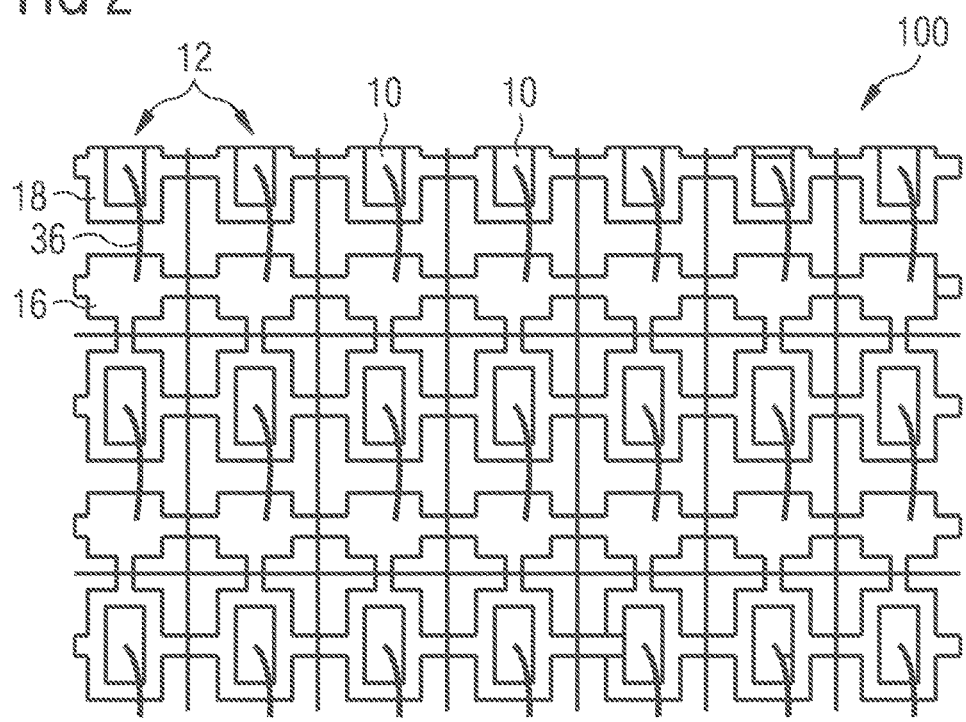
FIG. 2 shows a plan view of a second exemplary embodiment of a connection board, to which a method for inspecting an optoelectronic component is applicable.

FIG. 2 shows a plan view of a second exemplary embodiment, designated overall by 100, of a connection board to which the method according to the invention is applicable. Optoelectronic components 10 are once again arranged on the connection board 100, which is likewise a lead frame composite made of metal, for example. Compared with the exemplary embodiment illustrated in FIG. 1, the connection board 100 has a different geometry. More specifically, each of the connection conductor regions 12 comprises two connection conductors 16, 18, which are formed as lead frames spaced apart from one another laterally. The marginal region of the connection board, which can be in the shape of, e.g., a frame, is not illustrated in FIG. 2. However, it can also be part of the resonant circuit, i.e., current can flow through it.

Figure 3:
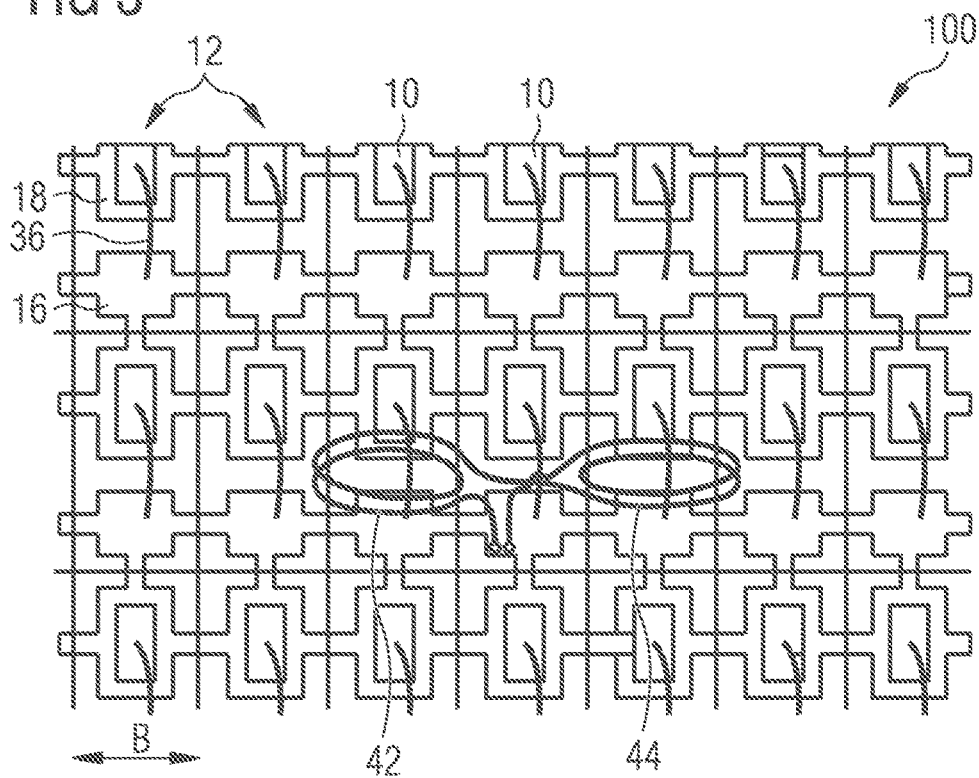
FIG. 3 shows a first embodiment of a method for inspecting an optoelectronic component.

FIG. 3 schematically shows a first embodiment of a method for inspecting an optoelectronic component. It shows the connection board 100 illustrated in FIG. 2, above or below which a double coil is arranged, which comprises a first coil 42 and a second coil 44. The arrangement of the double coil 42, 44 is illustrated only in diagrammatic form. The double coil 42, 44 generates a temporally variable electromagnetic alternating field, which induces an electrical alternating voltage in a local region of the connection board 100 and thus excites an electromagnetic resonant circuit. The excitation of the electromagnetic resonant circuit here takes place in a manner similar to that already explained in association with FIG. 1. The first coil 42 and the second coil 44 are spaced apart from one another laterally, more specifically in a direction parallel to a main extension plane of the connection board 100 and perpendicular to the central axes or axes of symmetry of the two coils 42, 44. A distance between the central axis of the first coil 42 and the central axis of the second coil 44 in a lateral direction in this case is between 1 mm and 10 cm, preferably between 1 cm and 5 cm.

The first coil 42 and the second coil 44 are connected to one another in series and the same alternating current flows through both during operation. The first coil 42 and the second coil 44 are optionally each wound round a ferrite core in order to achieve a better magnetic field convergence (not illustrated).

The distance between the central axis of the first coil 42 and the central axis of the second coil 44 preferably corresponds substantially to twice the width B of one of the connection conductor regions 12. This makes it possible to arrange the two coils 42, 44 below two connection conductor regions 12 in such a way that a connection conductor region arranged between them lies centrally between the two coils 42, 44. The optoelectronic component arranged therein can thus be selectively excited to emit electromagnetic radiation or can be selectively inactive depending on whether a magnetic field inside the first coil 42 is directed parallel or antiparallel to a magnetic field inside the second coil 44.

Figure 4:
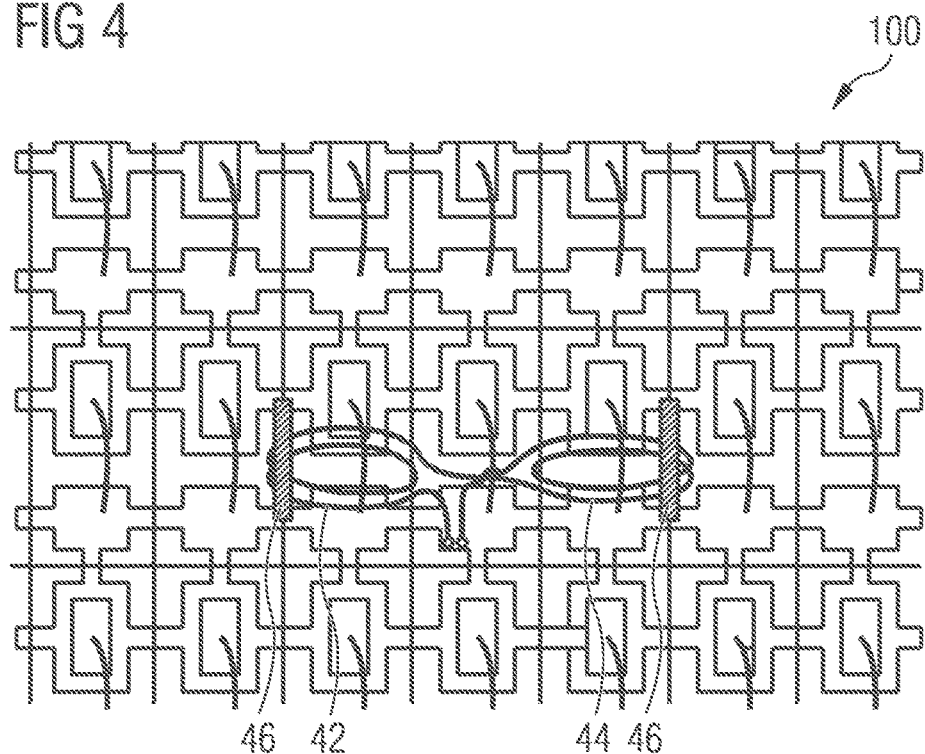
FIG. 4 shows a second embodiment of a method for inspecting an optoelectronic component.

FIG. 4 schematically shows a second embodiment of a method for inspecting an optoelectronic component. In this embodiment, in addition to the coils 42, 44, electrical contacts 46, e.g., needle contacts or pogo pins, are provided, which are arranged such that short circuit paths are generated on the connection board 100. As a result, defined current paths are obtained and, e.g., undesired leakage current paths are reduced.

Figure 5:
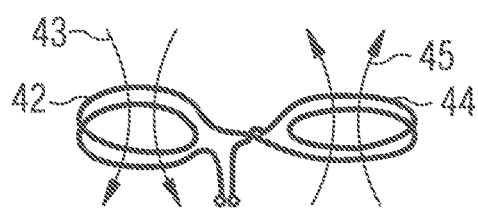
FIGS. 5 and 6 show the portions of a magnetic field generated by two coils, FIGS. 7 and 8 each show a flat coil for use in a further embodiment of a method for inspecting an optoelectronic component.
Figure 6:
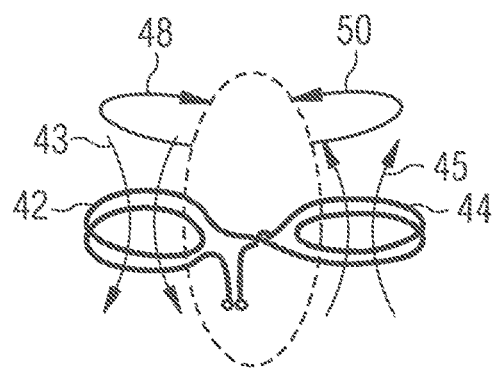

FIGS. 5 and 6 schematically show the portions of the magnetic field 43, 45 generated by the two coils 42, 44. The two coils 42, 44 are wound in opposite directions, such that the magnetic field 43 inside the first coil 42 is always directed antiparallel to the magnetic field 45 inside the second coil 44. As a result, two voltages 48, 50 having opposite rotational directions are induced by the two coils on the connection board, which voltages add in a region in the center between the two coils 42, 44. An electromagnetic resonant circuit is or electromagnetic resonant circuits are then excited only in a reduced area of the connection board or only with induced voltages that are capable of exciting the optoelectronic components to emit electromagnetic radiation.

Figure 7:
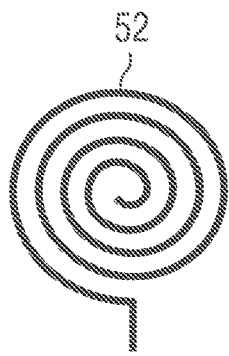
Figure 8:
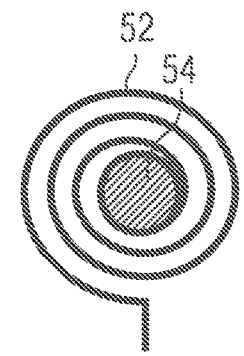

FIG. 7 shows a diagram of a flat coil 52 for use in a third embodiment of a method for inspecting an optoelectronic component. The flat coil 52 is formed by a wound metal wire, has the shape of an Archimedean spiral and in the present case has four windings. An even better field convergence can be obtained by means of a higher number of windings. Alternatively or additionally, an increase in the generated field strength can also be achieved by the arrangement of a ferrite core 54 in the center of the flat coil 52 (see FIG. 8).

Figure 9:
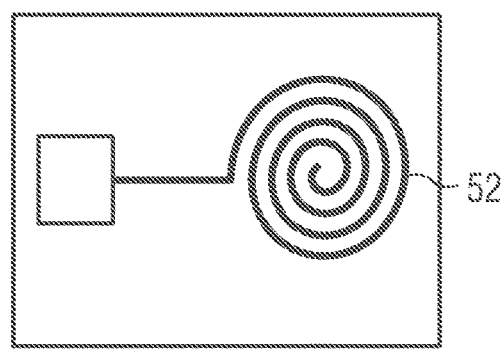
FIGS. 9 to 12 show further embodiments of the flat coil.
Figure 10:
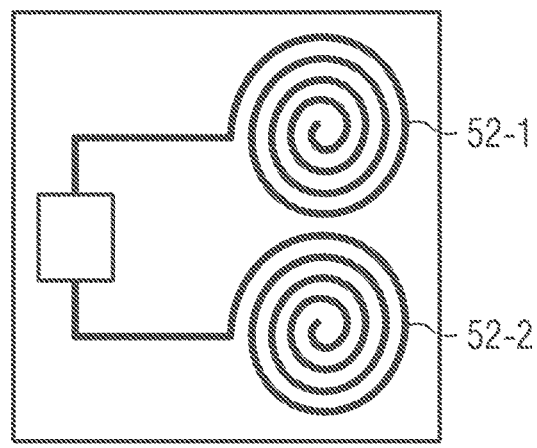
Figure 11:
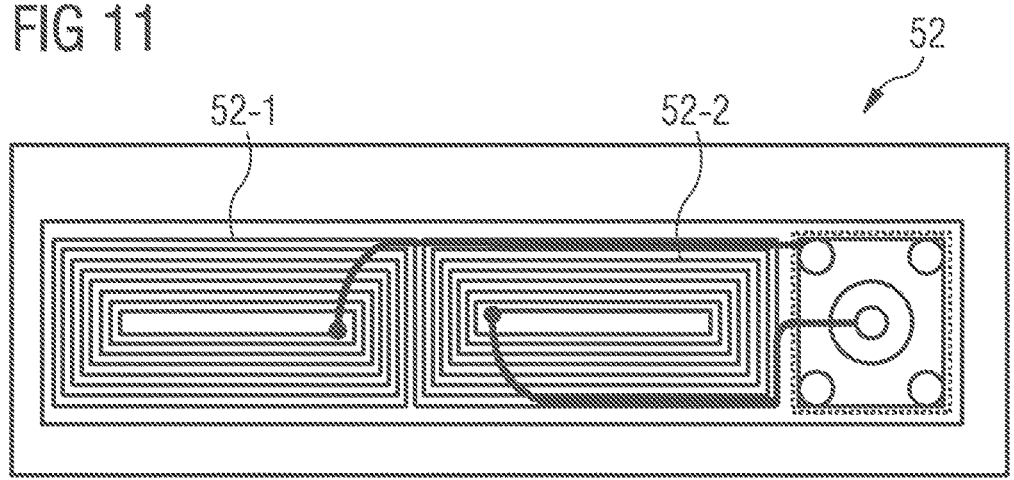

FIGS. 9 to 11 show embodiments in which the flat coil 52 is formed by a patterned circuit board. An arrangement of this type can be produced in particular by photochemical etching of a circuit board. Depending on the part size and available space, the use of a ferromagnetic element for additional field convergence is also feasible.

FIGS. 10 and 11 show special embodiments in which selective excitation of one or a few optoelectronic components on the connection board is made possible by the fact that two flat coils 52-1 and 52-2 are formed by the patterned circuit board. The windings in this case can have a circular or rectangular basic shape. Depending on the direction of the windings of the flat coils 52-1 and 52-2 and the flow of current through them during operation, for example magnetic fields either parallel or antiparallel to one another can be generated inside them.

Figure 12:
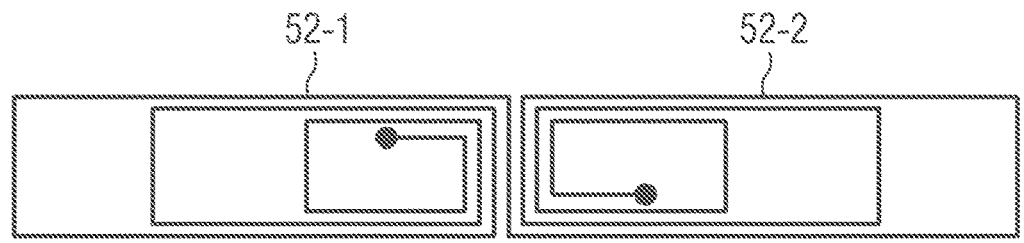

In FIG. 12, two flat coils 52-1, 52-2 are shown which have offset windings in each case. The centers of gravity of the windings here are arranged next to one another along a straight line in each case. In addition, the circumference of the windings in each of the two flat coils 52-1, 52-2 decreases along the straight line. As a result, the flat coils 52-1, 52-2 each have a region with a higher winding density and a region with a lower winding density. The regions of the two flat coils 52-1, 52-2 with a higher winding density face towards one another; the regions with a lower winding density face away from one another.

Differing from the illustration in FIG. 12, the two coils with offset windings do not have to be flat coils but can also be coils with conventional winding technology.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The invention claimed is:

1. A method for inspecting at least one optoelectronic component arranged on a connection board, the method comprising:
exciting at least one electromagnetic resonant circuit, formed by the at least one optoelectronic component and the connection board, such that the at least one optoelectronic component emits electromagnetic radiation,
wherein exciting the electromagnetic resonant circuit comprises applying an electrical alternating voltage in the electromagnetic resonant circuit by generating a temporally variable electromagnetic alternating field by a first coil and a second coil, wherein the first coil and the second coil are movable with respect to the connection board.

2. The method according to claim 1, wherein the first coil and the second coil are arranged at a lateral distance from one another.

3. The method according to claim 1, wherein a distance between a central axis of the first coil and a central axis of the second coil is between 1 mm and 10 cm in a lateral direction.

4. The method according to claim 1, wherein a current flowing through the first coil is proportional to a current flowing through the second coil.

5. The method according to claim 1, wherein an alternating current flows through the first coil and the second coil.

6. The method according to claim 1, wherein a magnetic field inside the first coil is directed antiparallel to a magnetic field inside the second coil.

7. The method according to claim 1, wherein a magnetic field inside the first coil is directed parallel to a magnetic field inside the second coil.

8. The method according to claim 1, wherein a first portion of the temporally variable electromagnetic alternating field, which is generated by the first coil, and a second portion of the temporally variable electromagnetic alternating field, which is generated by the second coil, are each incapable of exciting the optoelectronic component to emit electromagnetic radiation.

9. The method according to claim 1, wherein each of the first and second coils has a region with a higher winding density and a region with a lower winding density located opposite thereto in a lateral direction, wherein the regions of the first and second coils with a higher winding density face towards one another and the regions of the first and second coils with a lower winding density face away from one another.

10. A method for inspecting at least one optoelectronic component arranged on a connection board, the method comprising:
exciting at least one electromagnetic resonant circuit, formed by the at least one optoelectronic component and the connection board, such that the at least one optoelectronic component is excited to emit electromagnetic radiation; and
measuring at least one electro-optical property of the at least one optoelectronic component, wherein exciting the electromagnetic resonant circuit comprises applying an electrical alternating voltage in the electromagnetic resonant circuit by generating a temporally variable electromagnetic alternating field by a flat coil.

11. The method according to claim 10, wherein the flat coil has a shape of an Archimedean spiral at least in some regions.

12. The method according to claim 10, wherein the flat coil has at least two windings.

13. The method according to claim 10, wherein the flat coil has a ferrite core.

14. The method according to claim 10, wherein the flat coil is formed by a wound metal wire.

15. The method according to claim 10, wherein the flat coil is formed by a patterned circuit board.

16. The method according to claim 10, wherein at least one electro-optical property of the at least one optoelectronic component is measured.

17. A device for inspecting an optoelectronic component, the device comprising:
   a connection board on which the optoelectronic component to be measured is arranged; and
   means for exciting an electromagnetic resonant circuit, which comprises the connection board and the optoelectronic component, wherein the means comprises a first coil and a second coil or wherein the means comprises a flat coil.

18. The device according to claim 17, wherein the first coil and the second coil are each in a form of a flat coil.

19. The device according to claim 17, wherein the first coil and the second coil or the flat coil is/are formed by a patterned circuit board.

* * * * *